United States Patent [19]

Ishii

[11] Patent Number: 4,520,322

[45] Date of Patent: May 28, 1985

[54] POWER AMPLIFIER HAVING IMPROVED POWER SUPPLY CIRCUIT

[75] Inventor: Satoshi Ishii, Tokyo, Japan

[73] Assignee: Pioneer Electronic Corporation, Tokyo, Japan

[21] Appl. No.: 459,077

[22] Filed: Jan. 19, 1983

[30] Foreign Application Priority Data

Jan. 20, 1982 [JP] Japan ................................ 57-6216[U]

[51] Int. Cl.³ .............................................. H03F 3/30
[52] U.S. Cl. .................................... 330/263; 330/297
[58] Field of Search ............... 330/202, 263, 267, 268, 330/297

[56] References Cited
U.S. PATENT DOCUMENTS 4,329,657 5/1982 Kamiya ................................ 330/297

Primary Examiner—James B. Mullins
Attorney, Agent, or Firm—Sughrue, Mion, Zinn, Macpeak & Seas

[57] ABSTRACT

A power amplifier, suitable for use as an audio amplifier, having an improved power supply circuit in which distortion caused by switching between power supply levels is substantially eliminated. Transistors of a push-pull amplifier stage are selectively couplable to either first or second supplies, with the output voltages of the second supplies exceeding those of the first supplies. In ordinary operation, switching of the output transistors between the first and second supplies is done in accordance with an absolute magnitude of the output signal from the amplifier. However, when the magnitude of high frequency components in the output signal exceeds a certain level, the output transistors of the push-pull stage are supplied power only from the first supplies.

5 Claims, 8 Drawing Figures

POWER AMPLIFIER HAVING IMPROVED POWER SUPPLY CIRCUIT

BACKGROUND OF THE INVENTION

The present invention relates to an amplifier having an improved power supply circuit. More particularly, the invention relates to a power amplifier having an improved power supply circuit.

To improve the power conversion efficiency of a power amplifier, a technique of changing the supply voltage level according to a circuit output signal level has been employed. FIG. 1 shows an example of a circuit constructed in accordance with such a technique, wherein a signal applied to an input terminal 1 is amplified by a voltage-amplifying stage 2 before being applied to a complementary push-pull power amplifying stage composed of transistors Q1 and Q2 for power amplification. The push-pull stage output is applied to a load 13, such as a speaker, provided between the output terminal 3 and a ground terminal 4.

To supply power to the power-amplifying stage, first voltage supplies 7 and 8 and second voltage supplies 9 and 10 are provided. The relationship between the output voltages $\pm B_L$ of the first supplies 7 and 8 and the output voltages $\pm B_H$ of the second supplies 9 and 10 is set to satisfy $|B_L| < |B_H|$.

In addition, differential amplifiers 5 and 6 are provided for shifting the circuit output level by a constant voltage $|E|$ applied to first input terminals a from reference voltage supplies 11 and 12. The collector terminals (which are also the supply terminals in the power-amplifying stage) of the transistors Q1 and Q2 are applied to input terminals b of the differential amplifiers 5 and 6. The outputs of the differential amplifiers 5 and 6 provide inputs for controlling the bases of transistors Q3 and Q4, which are connected as active elements between the collector terminals of the transistors Q1 and Q2 and the second voltage supplies 9 and 10, respectively. Thus, a first negative feedback amplifier circuit is constituted by the amplifier 5 and the transistor Q3, and a second by the amplifier 6 and the transistor Q4. With this arrangement, as long as the transistors Q3 and Q4 are in an active state, a voltage obtained by shifting the circuit output level by a constant value is applied to the collector terminals of the transistors Q1 and Q2.

In addition, the output voltages $\pm B_L$ of the first voltage supplies 7 and 8 are supplied to the collector terminals of the transistors Q1 and Q2 via respective diodes D1 and D2. As a result, if the level of the circuit output signal $V_o$ is below $|B_L| > |V_o + E|$, the transistors Q3 and Q4 will be off. Therefore, power is supplied to the transistors Q1 and Q2 from the respective first voltage supplies 7 and 8. On the other hand, if the level of the circuit output signal $V_o$ is above $|B_L| \leq |V_o + E|$, the diodes D1 and D2 will be turned off. Then the collector outputs from the transistors Q3 and Q4 are applied to the transistors Q1 and Q2 in place of the voltages from the first supplies 7 and 8. In this case, since negative feedback amplifier circuits are constituted by the amplifiers 5 and 6 and the transistors Q3 and Q4, respectively, the voltages applied to the collectors of each of the transistors Q1 and Q2 is at a level of $|V_o + E|$ because of the negative feedback action.

FIG. 3 is a waveform diagram indicating the aforementioned operation, and FIG. 4 shows the relationship between output power and lost power. In FIG. 4, solid and dotted lines respectively indicate the power loss versus output power characteristic of the circuit configuration of FIG. 1 and the same characteristic for a circuit configuration in which the supply level is always kept constant. It may be seen that the power conversion efficiency is very significantly better with the circuit shown in FIG. 1.

FIG. 2 is a schematic diagram showing a specific example of the circuit shown in FIG. 1, wherein the differential amplifier 5 is composed of transistors Q7 and Q8, resistors R1-R5, and a current source I1, the differential amplifier 6 includes transistors Q9 and Q10, resistors R6-R10, and a current source I2. The outputs of the differential amplifiers 5 and 6 are used as the inputs for driving the bases of the transistors Q5 and Q6, which are connected to the transistors Q3 and Q4 in a Darlington configuration. Capacitors C1 and C2, coupled between the bases and collectors of the transistors Q5 and Q6, are used for phase compensation. Zener diodes D3 and D4 form the reference voltage sources 11 and 12 for shifting the circuit output level. Current sources I3 and I4 are provided for supplying current for operating the diodes D3 and D4. Other parts constituting the circuit are the same as those shown in FIG. 1.

In the circuit configuration shown in FIGS. 1 and 2, the instant that the transistors Q3 and Q4 assume their active states when the input signal level becomes sufficiently high, the states of the diodes D1 and D2 are changed from on to off. At this time, although the diodes D1 and D2 are reverse biased, some amount of current continues to flow therethrough. In addition, since there always exists a time lag until the transistors Q3 and Q4 reach their active states, the high frequency response of the circuit is not adequate in some instances. Moreover, when the states of the transistors Q3 and Q4 are changed from on to off and when those of the diodes are changed from off to on, the same phenomenon occurs, which greatly adversely affects the output signal. Shown in the lowermost portion in FIG. 3 is an example of a distorted waveform due to the above-mentioned phenomenon in the case of the high frequency signal.

An object of the present invention is therefore to provide a power supply circuit for an amplifier wherein the occurrence of such distortion is suppressed as much as possible by preventing undesirable effects caused by on and off switching of active elements while yet maintaining an excellent power conversion efficiency.

SUMMARY OF THE INVENTION

The power supply circuit of the amplifier of the invention, in satisfaction of these objects, includes first voltage supplies, second voltage supplies having output voltages higher than those of the first supplies, means for generating a voltage related to an amplifier output signal level, means for supplying to the amplifier the output voltage of the voltage-generating means instead of the voltages of the first voltage supplies when the voltage of the voltage-generating means is higher than those of the first voltage supplies, and means for supplying to the amplifier the voltages of the second voltage supplies instead of the output voltage of the voltage-generating means when the high frequency component of the amplifying output signal is at a level higher than a predetermined level.

DESCRIPTION OF THE PREFERRED EMBODIMENTS

Figure 1:
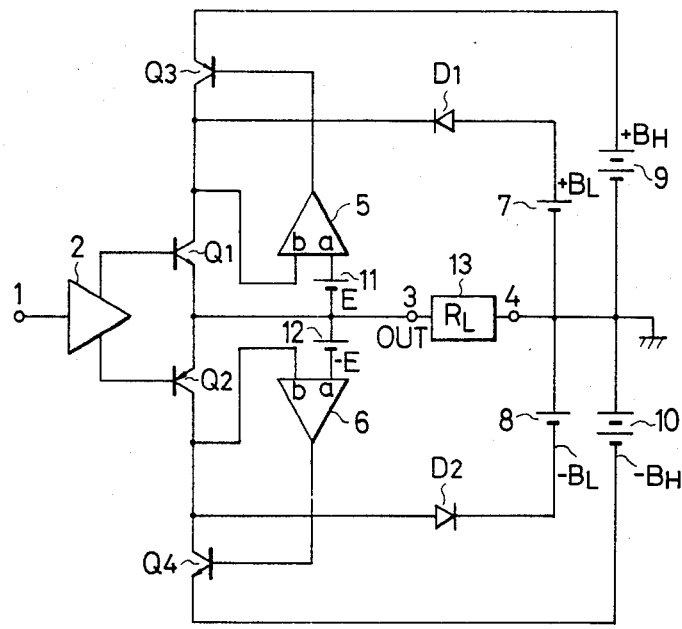
FIG. 1 is a diagram illustrating an example of a prior art supply circuit for a power amplifier.
Figure 5:
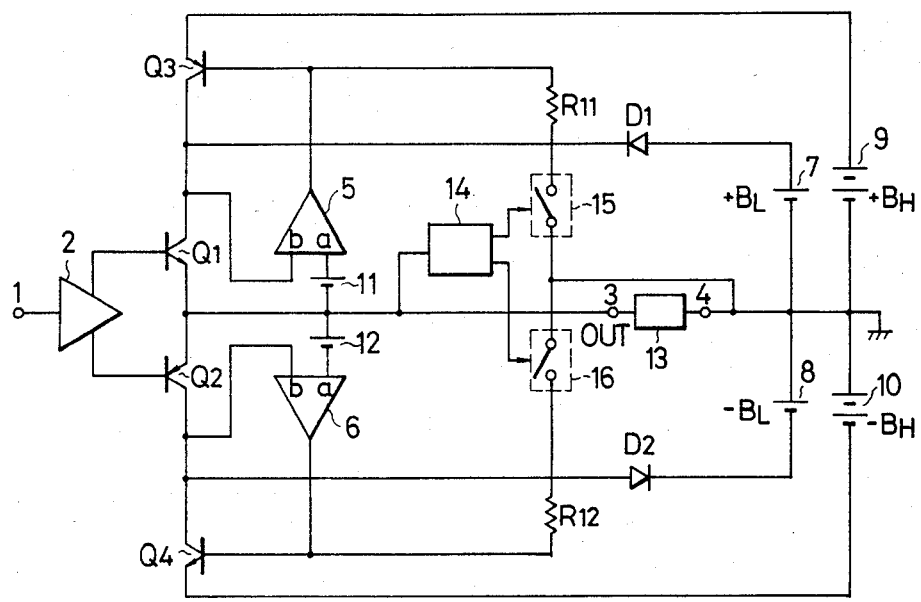
FIG. 5 is a block diagram of an amplifier circuit of the present invention.

FIG. 5 is a block diagram of an amplifier circuit of the present invention, wherein like reference numerals and characters designate like or corresponding parts in common with the circuit of FIG. 1.

The amplifier output signal is inputted to a circuit 14 (newly added) for detecting the level of a high frequency component in the amplifier output signal. In response to the operation of the circuit 14, each of switches 15 and 16 is turned on when the absolute value of the level of the high frequency component exceeds a predetermined value. When the switches 15 and 16 are operated, the bases of the transistors Q3 and Q4 are clamped at ground level via resistors R11 and R12, respectively. As a result, the transistors Q3 and Q4 are operated at saturation. In this mode it is possible to ignore the $V_{CE}$ (voltage across the collector and emitter) drop, so that operating voltages of $\pm B_H$ are supplied to the transistor Q1 and Q2 from the second voltage supplies 9 and 10, that is, at a higher voltage than before.

Figure 2:
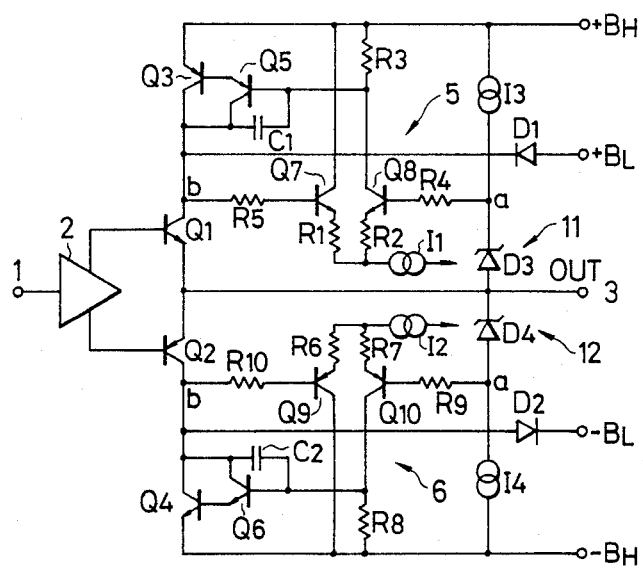
FIG. 2 is a circuit diagram illustrating a specific example of the circuit of FIG. 1.
Figure 3:
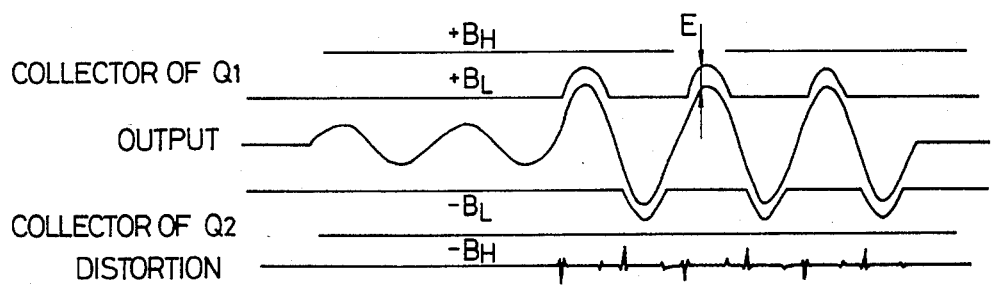
FIG. 3 is a waveform diagram related to the circuits in FIGS. 1 and 2.
Figure 4:
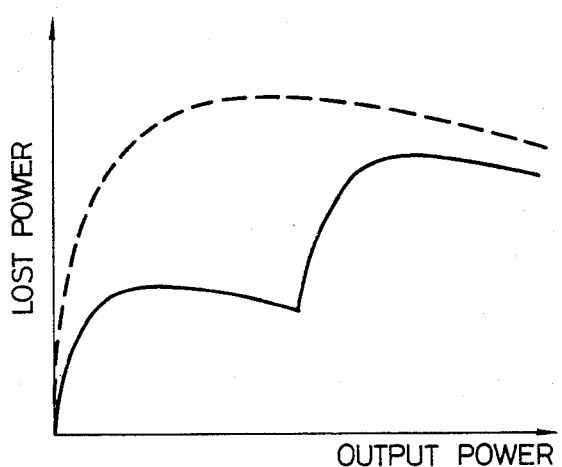
FIG. 4 is a graphical representation illustrating characteristics of the circuits in FIGS. 1 and 2.
Figure 6:
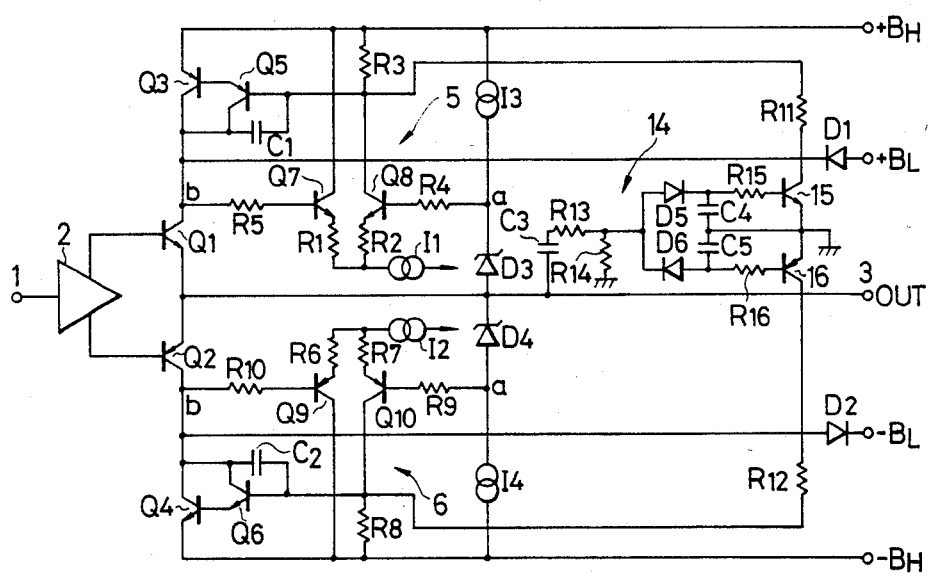
FIGS. 6 and 7 are circuit diagrams of specific examples of an amplifier circuit present invention and FIG. 8 is an waveform diagram showing waveforms of signals in the circuit of FIG. 5.

FIG. 6 shows a specific example of a circuit constructed according to the present invention, namely, a specific example of the circuit of FIG. 5. In FIG. 6, like reference numerals and characters designate like or corresponding parts in FIG. 2. With a capacitor C3 and resistors R13 and R14, which form the circuit 14 for detecting the level of a high frequency component, the intermediate and low frequency components of the amplified output signal are cut off and the resultant signal voltage divided in magnitude. The signal thus formed passes through diodes D5 and D6 and charges capacitors C4 and C5. The charged voltage becomes the input for controlling the bases of the switching elements 15 and 16 through resistors R15 and R16. When the elements 15 and 16 are turned on, each of the transistors Q3, Q5 and Q4, Q6 become saturated, and thus the collectors of the output transistors Q1 and Q2 are set at voltages substantially equal to the second supply voltages $\pm B_H$. The potentials $\pm B_H$ are applied until the charges of the capacitors C4 and C5 are depleted.

Figure 8:
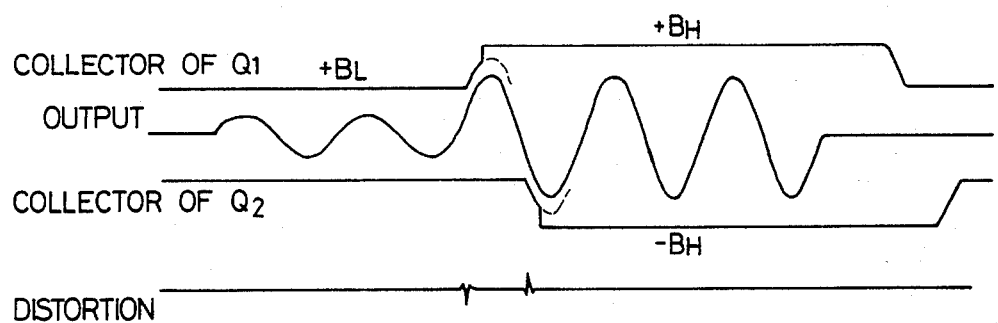

FIG. 8 is a waveform diagram illustrating these low and high levels in the case of a high frequency signal. As is made clear by FIG. 8, because the diodes D1 and D2 and the transistors Q3 and Q4 are turned on and off in response to the level of the high frequency component, and then within the time of one or two cycles of the signal being amplified, the amount of distortion occurring at the time that these elements are switched is quite significantly reduced. In addition, the circuit 4 which detects the high frequency component level will not operate in response to intermediate and low frequency components, and therefore entirely the same power conversion efficiency as in the circuit is shown in FIG. 1 is provided. Accordingly, the inventive circuit configuration is most suitable for use in an amplifier for audio equipment which must handle music signals having a large amplitude in the intermediate and low frequency ranges and a small amplitude in high frequency ranges.

Figure 7:
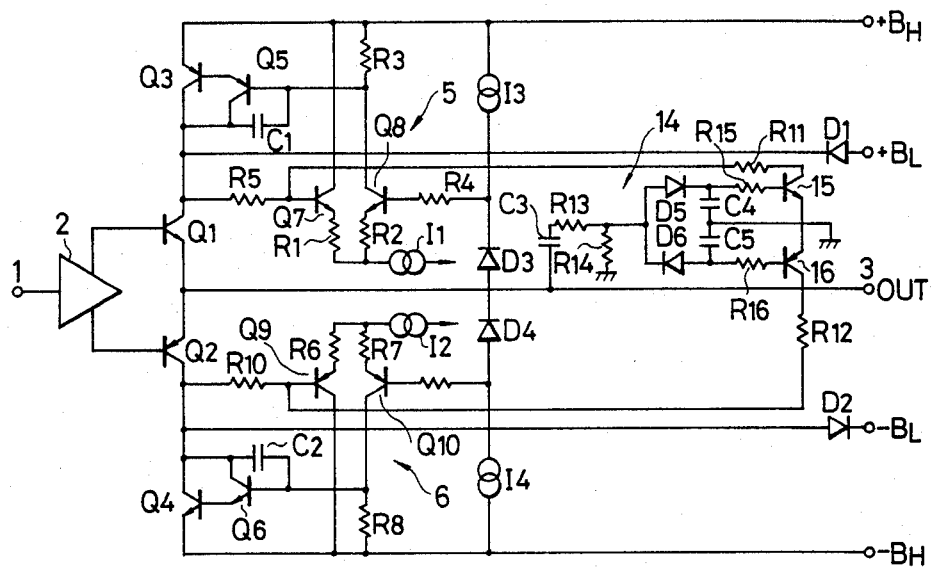

FIG. 7 shows another example of a circuit according to the present invention, wherein the base potentials of the transistors Q7 and Q8 of the differential amplifiers 5 and 6 are clamped to ground potential using the outputs of the switching elements 15 and 16. The construction other than this is the same as what is shown in FIG. 6. Accordingly, because the transistors Q7 and Q9 of the differential amplifiers 5 and 6 are turned off because of the operation of the switching transistors 15 and 16, the total current I1 and I2 flow into the transistors Q8 and Q10 so that the transistors Q3, Q5 and Q4, Q6 are saturated. Therefore, each of the collector terminals of the transistors Q1 and Q2 is supplied substantially with the high voltage $\pm B_H$.

As described above, it is possible with the invention to suppress the occurrence of distortion of an output signal to a very great extent, while yet high amplifier efficiency is maintained. Thus, the circuit of the invention is most suitable for use in an audio amplifier.

I claim:

1. A power amplifier having an improved power supply circuit, comprising: a power amplifying stage with an output terminal; two first voltage supplies; two second voltage supplies having output voltages greater than output voltages of said first supplies; first and second differential amplifiers, said first differential amplifier having a first input terminal coupled to said power amplifying stage and said second differential amplifier having a first input terminal coupled to said power amplifying stage; first and second bias voltage supplies E connected between said output terminal and second input terminals of respective ones of said first and second differential amplifiers; first and second diodes coupling said first supplies to said power amplifying stage, respectively; first and second transistors having curent-carrying paths coupled between said power amplifying stage and said second supplies for coupling said second supplies to said power amplifying stage, bases of said first and second transistors being coupled to outputs of said first and second differential amplifiers, respectively; means for sensing a magnitude of a high frequency component of an output signal at said output terminal; and switching means for grounding said bases of said first and second transistors when an output signal of said high frequency component sensing means exceeds a predetermined level indicative of a predetermined magnitude of said high frequency component.

2. The power amplifier of claim 1, wherein said high frequency component sensing means comprises a capacitor having a first terminal coupled to said output terminal; and first and second resistors connected to voltage-divide a voltage produced on a second terminal of said capacitor.

3. The power amplifier of claim 2, wherein said switching means comprises third and fourth transistors connected respectively between bases of said first and second transistors and ground and having bases connected to receive the voltage-divided signal produced by said first and second resistors.

4. The power amplifier of claim 3, wherein said switching means further comprises, for each of said third and fourth transistors, a third resistor having a first terminal coupled to said base, a capacitor coupled between a second terminal of said third resistor and ground, and a diode coupled between said second terminal of said third resistor and a junction point between said first and second resistors.

5. The power amplifiers circuit of claim 4, wherein said first and second transistors each comprise a Darlington-connected transistor pair.

* * * * *